United States Patent
Chien

(10) Patent No.: US 7,538,018 B2
(45) Date of Patent: May 26, 2009

(54) GATE STRUCTURE AND METHOD FOR FABRICATING THE SAME, AND METHOD FOR FABRICATING MEMORY AND CMOS TRANSISTOR LAYOUT

(75) Inventor: Jung-Wu Chien, Hsinchu (TW)

(73) Assignee: ProMOS Technologies Inc., Hsinchu (TW)

( * ) Notice: Subject to any disclaimer, the term of this patent is extended or adjusted under 35 U.S.C. 154(b) by 191 days.

(21) Appl. No.: 11/670,427

(22) Filed: Feb. 2, 2007

(65) Prior Publication Data
US 2008/0138970 A1 Jun. 12, 2008

(30) Foreign Application Priority Data
Dec. 6, 2006 (TW) .............................. 95145340 A

(51) Int. Cl.
*H01L 21/28* (2006.01)
(52) U.S. Cl. .................... 438/595; 438/197; 438/199; 438/585; 257/E21.177
(58) Field of Classification Search ................ 257/900, 257/E21.002, 177, 51, 384, 419, 457, 645; 438/275, 592, 595, 589, 197, 199, 200, 585, 438/627, 229, 230, 299, 142, 584, 304
See application file for complete search history.

(56) References Cited

U.S. PATENT DOCUMENTS

| | | | | |
|---|---|---|---|---|
| 6,159,835 A | * | 12/2000 | Visokay et al. | ............... 438/592 |
| 6,716,046 B2 | * | 4/2004 | Mistry | ......................... 439/270 |
| 2006/0017165 A1 | * | 1/2006 | Ni et al. | ....................... 257/754 |
| 2007/0087536 A1 | * | 4/2007 | Chan et al. | ................... 438/585 |
| 2007/0170511 A1 | * | 7/2007 | Huang | ......................... 257/355 |

* cited by examiner

*Primary Examiner*—Matthew C Landau
*Assistant Examiner*—Yu-Hsi Sun
(74) *Attorney, Agent, or Firm*—Jianq Chyun IP Office

(57) ABSTRACT

A method for fabricating a gate structure is provided. A pad oxide layer, a pad conductive layer and a dielectric layer are sequentially formed over a substrate. A portion of the dielectric layer is removed to form an opening exposing a portion of the pad conductive layer. A liner conductive layer is formed to cover the dielectric layer and the pad conductive layer. A portion of the liner conductive layer and a portion of the pad conductive layer are removed to expose a surface of the pad oxide layer to form a conductive spacer. The pad oxide layer is removed and a gate oxide layer is formed over the substrate. A first gate conductive layer and a second gate conductive layer are sequentially formed over the gate oxide layer. A portion of the gate oxide layer is removed and a cap layer to fill the opening.

26 Claims, 17 Drawing Sheets

GATE STRUCTURE AND METHOD FOR FABRICATING THE SAME, AND METHOD FOR FABRICATING MEMORY AND CMOS TRANSISTOR LAYOUT

CROSS-REFERENCE TO RELATED APPLICATION

This application claims the priority benefit of Taiwan application serial no. 95145340, filed Dec. 6, 2006. All disclosure of the Taiwan application is incorporated herein by reference.

BACKGROUND OF THE INVENTION

1. Field of the Invention

The present invention generally relates to a semiconductor device and a method for fabricating the same, and more particularly, to a gate structure and a method for fabricating the same, and a method for fabricating a memory.

2. Description of Related Art

Currently, memory cells are often fabricated together with their peripheral circuits in order to shorten the processing time and to simplify the processing process. Furthermore, transistors having certain characteristic functions are often respectively formed in the memory cell area and the peripheral circuit area, according to the functions required in the device. Specifically, transistors of a dynamic random access memory (DRAM) include transistors in the memory cell area and transistors in the peripheral circuit area.

Typical transistors in a conventional memory cell area have a stack type gate structure. When circuits become more integrated and dimension of the device become smaller and smaller, channels of the transistors thereof are shortened accordingly. Such shortened channels often cause short channel effect (SCE). In order to resolve the SCE problem, a recess channel process is often conducted to elongate the length of the channel, and thus reducing the SCE and the leakage current thereof. Typically, a recess channel process often includes steps of: forming a recess in a substrate, forming a conformal gate oxide layer in the recess, forming a conductive layer to cover the gate oxide layer and fill the recess, and performing a patterning process to define a gate structure. Typically, the foregoing patterning process include: covering an area in which the gate structure is to be formed later with a patterning photo-resistant layer; and removing the conductive layer which is uncovered by the patterning photo-resistant layer. However, in the foregoing conventional recess channel process, an alignment error often exists between the patterning photo-resistant layer and the conductive layer. Therefore, it is hard to correctly define the gate structure.

Further, typical transistors in a conventional peripheral circuit area are complementary metal oxide semiconductor (CMOS) transistors, including N-type CMOS (NMOS) transistors, and P-type CMOS (PMOS) transistors. In more concentrated integrated circuit and smaller devices, PMOS transistors are more likely to cause SCE. In order to resolve this problem, a metal gate process is often performed to replace a poly-silicon gate with a metal gate. However, the metal gate process brings problems of poor thermal stability and undesired gate dopant diffusion.

Accordingly, it is an important concern to avoid the above problems and produce high-quality devices.

SUMMARY OF THE INVENTION

Accordingly, the present invention is directed to a gate structure and a method for fabricating the same, and a method for fabricating a memory, in which alignment error in defining the gate structure, poor thermo stability and dopant diffusion may be effectively reduced, thus improving process yield.

The present invention provides a method for fabricating a gate structure. First, a pad oxide layer, a pad conductive layer and a dielectric layer are sequentially formed on a substrate. Next, a portion of the dielectric layer is removed to form an opening exposing a portion of the pad conductive layer. Next, a liner conductive layer is formed to conformably cover the dielectric layer and the pad conductive layer. Next, a portion of the liner conductive layer and a portion of the pad conductive layer are removed to expose a surface of the pad oxide layer to form a conductive spacer at a sidewall of the opening. Next, the pad oxide layer at a bottom of the opening is removed. Next, a gate oxide layer is formed over the substrate. Next, a first gate conductive layer and a second gate conductive layer are sequentially formed on the gate oxide layer at the bottom of the opening, wherein an upper surface of the second gate conductive layer is substantially lower than an upper surface of the dielectric layer. Next, a portion of the gate oxide layer is removed, so that an upper surface of the gate oxide layer is lower than the upper surface of the second gate conductive layer. Next, a cap layer is formed to fill the opening.

According to an embodiment of the present invention, the gate oxide layer is removed by, for example, an etching process.

According to an embodiment of the present invention, a material of the foregoing cap layer is, for example, silicon nitride.

According to an embodiment of the present invention, a material of the foregoing first gate conductive layer is, for example, poly-silicon or doped poly-silicon.

According to an embodiment of the present invention, a material of the foregoing second gate conductive layer is, for example, tungsten silicide, tungsten, titanium silicide, titanium, tantalum silicide or tantalum.

According to an embodiment of the present invention, the method for fabricating a gate structure further includes the steps of removing the dielectric layer after forming the cap layer, and removing the conductive spacer and the pad conductive layer.

The present invention further provides another method for fabricating a gate structure. First, a pad oxide layer, a pad conductive layer and a dielectric layer are sequentially formed on a substrate. Next, a portion of the dielectric layer is removed to form an opening exposing a portion of the pad conductive layer. Next, a liner conductive layer is formed to cover the dielectric layer and the pad conductive layer. Next, a portion of the liner conductive layer and a portion of the pad conductive layer are removed to expose a surface of the pad oxide layer to form a conductive spacer at a sidewall of the opening. Next, the pad oxide layer at a bottom of the opening and a portion of the substrate are removed to form a recess in the substrate. Next, a gate oxide layer is formed over the substrate. Next, a first gate conductive layer, and a second gate conductive layer are sequentially formed in the recess and on the gate oxide layer over the bottom of the opening, wherein an upper surface of the second gate conductive layer is substantially lower an upper surface of the dielectric layer. Next, a portion of the gate oxide layer is removed until an upper surface of the gate oxide layer is substantially lower than the upper surface of the second gate conductive layer. Next, a cap layer is formed to fill the opening.

According to an embodiment of the present invention, the gate oxide layer is removed by, for example, an etching process.

According to an embodiment of the present invention, a material of the foregoing cap layer is, for example, silicon nitride.

According to an embodiment of the present invention, a material of the foregoing first gate conductive layer is, for example, poly-silicon or doped poly-silicon.

According to an embodiment of the present invention, a material of the foregoing second gate conductive layer is, for example, tungsten silicide, tungsten, titanium silicide, titanium, tantalum silicide, and tantalum.

According to an embodiment of the present invention, the method for fabricating a gate structure further includes the steps of removing the dielectric layer after forming the cap layer, and removing the conductive spacer and the pad conductive layer.

The present invention further provides a method for fabricating a memory. First, a substrate is provided, wherein the substrate having a memory cell area and a peripheral circuit area. Next, a pad oxide layer, a pad conductive layer and a dielectric layer are sequentially formed on the substrate. Next, a portion of the dielectric layer is removed to form a first opening in the memory cell area and a second opening in the peripheral circuit area, the first opening exposing portions of the pad conductive layer respectively. Next, a liner conductive layer is formed to cover the dielectric layer and the pad conductive layer. Next, a portion of the liner conductive layer and a portion of the pad conductive layer are removed to expose the pad oxide layer to form conductive spacers at sidewalls of respectively the first opening, and two second openings. Next, a portion of the pad oxide layer at a bottom of the first opening and a portion of the substrate are removed to form a recess in the substrate, and the pad oxide layer at bottoms of the two second openings are also removed. Next, a gate oxide layer is formed over the substrate. Next, a first gate conductive layer is formed in the recess and on the gate oxide layer over a bottom of the first opening, while a second gate conductive layer and a third gate conductive layer are respectively formed on bottoms of two second openings. Next, a fourth gate conductive layer is formed over the first, the second, and the third gate conductive layers, wherein an upper surface of the fourth gate conductive layer is lower than an upper surface of the dielectric layer. Next, a portion of the gate oxide layer is removed until an upper surface of the gate oxide layer is lower than the upper surface of the fourth gate conductive layer. Next, a cap layer is formed to fill up the first opening and the two second openings.

According to an embodiment of the present invention, the gate oxide layer is removed by, for example, an etching process.

According to an embodiment of the present invention, a material of the foregoing cap layer is, for example, silicon nitride.

According to an embodiment of the present invention, the foregoing first gate conductive layer is an N-type doped poly-silicon layer, the second gate conductive layer is one of an N-type doped poly-silicon layer and a P-type doped poly-silicon layer, and the third gate conductive layer is another one of the N-type doped poly-silicon layer and the P-type doped poly-silicon layer.

According to an embodiment of the present invention, a material of the foregoing fourth gate conductive layer is, for example, silicide, tungsten, titanium silicide, titanium, tantalum silicide or tantalum.

According to an embodiment of the present invention, the method for fabricating a memory further includes a step of performing a nitridation process to the gate oxide layer of the peripheral circuit area after forming the gate oxide layer over the substrate.

According to an embodiment of the present invention, the method for fabricating a memory further includes the steps of removing the dielectric layer after forming the cap layer, and removing the conductive spacers and the pad conductive layer.

The present invention further provides a gate structure. The gate structure includes a substrate, a first gate conductive layer, a second gate conductive layer, a gate oxide layer and a cap layer. The first gate conductive layer is disposed over the substrate. The second gate conductive layer is disposed over the first conductive layer. The gate oxide layer is disposed between the first gate conductive layer and the substrate, and at a sidewall of the first conductive layer and a portion of the second gate conductive layer. The cap layer is disposed on the gate oxide layer covering the second gate conductive layer.

According to an embodiment of the present invention, a material of the foregoing cap layer is, for example, made silicon nitride.

According to an embodiment of the present invention, a material of the foregoing first gate conductive layer is, for example, poly-silicon or doped poly-silicon.

According to an embodiment of the present invention, a material of the foregoing second gate conductive layer is, for example, tungsten silicide, tungsten, titanium silicide, titanium, tantalum silicide, or tantalum.

The present invention further provides another gate structure. The gate structure includes a substrate, a first gat conductive layer, a second gate conductive layer, a gate oxide layer and a cap layer. The first gate conductive layer is disposed in a recess exposing an upper surface of the substrate, wherein an upper surface of the first gate structure is higher than the upper surface of the substrate. The second gate conductive layer is disposed on the first gate conductive layer. The gate oxide layer is disposed between the first gate conductive layer and the substrate, and at a sidewall of the first gate conductive layer and a portion of the second gate conductive layer. The cap layer is disposed on the gate oxide layer covering the second gate conductive layer.

According to an embodiment of the present invention, a material of the foregoing cap layer is, for example, silicon nitride.

According to an embodiment of the present invention, a material of the foregoing first gate conductive layer is, for example, poly-silicon or doped poly-silicon.

According to an embodiment of the present invention, a material of the foregoing second gate conductive layer is, for example, tungsten silicide, tungsten, titanium silicide, titanium, tantalum silicide, or tantalum.

The present invention further provides a method for fabricating a CMOS transistor layout. The CMOS transistor at least includes an N-type transistor and a P-type transistor, wherein a gate electrode of the N-type transistor is disposed adjacent to a gate electrode of the P-type transistor. First, a pad oxide layer, a pad conductive layer, and a dielectric layer are sequentially formed over a substrate. Next, a portion of the dielectric layer is removed. Next, two openings that expose a portion of an upper surface of the pad conductive layer, and defining a first area where an N-type transistor is to be formed, and a second area where a P-type transistor is to be formed; then forming a liner conducive layer, conformably covering the dielectric layer and the pad conductive layer; then removing a portion of the liner conductive layer and a portion of the pad conductive layer to expose a surface of the pad oxide layer, and forming a conductive spacer at sidewalls of the two openings; then, conformably forming a gate oxide layer over the substrate; then, forming a first gate conductive layer and a second gate conductive layer on the gate oxide layer over bottoms of the two openings, respectively. Then, simultaneously forming a third gate conductive layer over the first and the second gate conductive layers, wherein upper surfaces of the third gate conductive layers are lower than an upper surface of the dielectric layer; then removing a portion of the gate oxide layer, so that an upper surface of the gate oxide layer is lower than the upper surfaces of the third gate conductive layers; then filling up the two openings with a cap layer.

According to an embodiment of the present invention, the gate oxide layer is removed by performing, for example, an etching process.

According to an embodiment of the present invention, a material of the cap layer is, for example, silicon nitride.

According to an embodiment of the present invention, the first gate conductive layer is comprised of an N-type doped poly-silicon layer or a P-type doped poly-silicon layer, and the second gate conductive layer is comprised of a N-type doped poly-silicon layer or a P-type doped poly-silicon layer.

According to an embodiment of the present invention, a material of the third gate conductive layer is, for example, tungsten silicide, tungsten, titanium silicide, titanium, tantalum silicide or tantalum.

According to an embodiment of the present invention, a nitridation process is performed on the gate oxide layer of the peripheral circuit area after forming the gate oxide layer over the substrate.

According to an embodiment of the present invention, the dielectric layer is removed after forming the cap layer, and the conductive spacers and the pad conductive layer are removed.

The method of the present invention is adapted for avoiding alignment errors when defining gate structures during a conventional recess channel process. Further, according to the gate structure of the present invention, the cap layer covers top surface of the gate conductive layer, thus protecting the gate conductive layer from damages due to subsequent processes. Particularly, the area where the transistor is to be formed is defined prior to forming the gate structure, and therefore gate dopant diffusion, which often occurs in subsequent thermal process in conventional CMOS transistors adversely affecting reliability of the device, can be effectively avoided.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 3A through 3K are cross-sectional views showing a flow of a method for fabricating a memory according to an embodiment of the present invention.

DESCRIPTION OF THE EMBODIMENTS

Figure 1A:
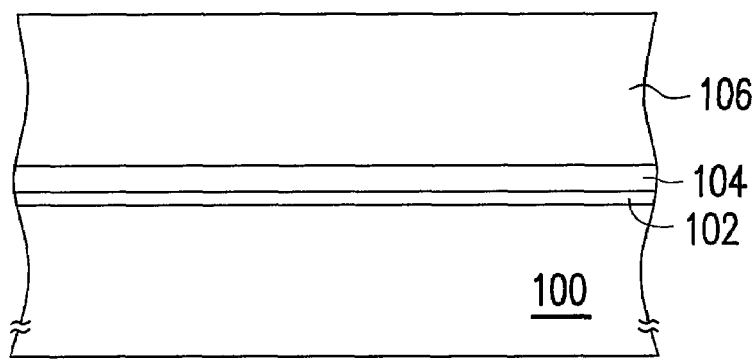
FIGS. 1A through 1I are cross-sectional views showing a flow of a method for fabricating a gate structure according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1I are cross-sectional views showing a flow of a method for fabricating a gate structure according to an embodiment of the present invention.

First, referring to FIG. 1A, a pad oxide layer 102 is formed on a substrate 100. A material of the pad oxide layer 102 is, for example, silicon oxide, and may be formed by performing, for example, a thermal oxidizing process. Next, a pad conductive layer 104 is formed on the pad oxide layer 102. A material of the pad conductive layer 104 is, for example, undoped poly-silicon, and may be formed by performing, for example, a chemical vapour deposition (CVD) process. Next, a dielectric layer 106 is formed on the pad conductive layer 104. A material of the dielectric layer 106 is, for example, phosphor silicon glass (PSG), boron phosphor silicon glass (BPSG), or other suitable dielectric materials, and may be formed by performing, for example, a CVD process.

Figure 1B:
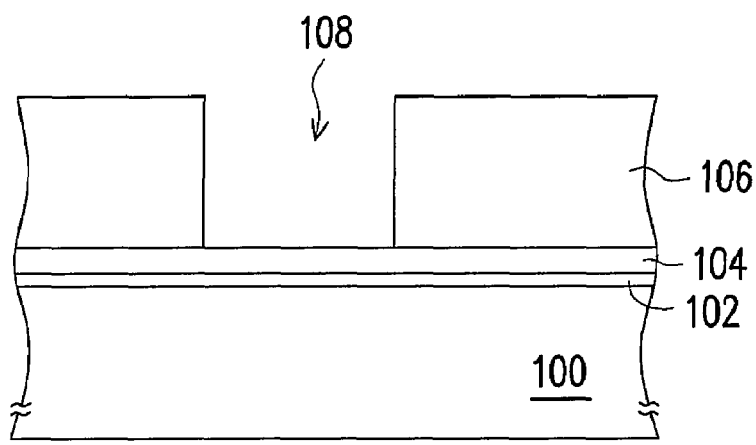

Next, referring to FIG. 1B, a portion of the dielectric layer 106 is removed to form an opening 108 exposing a portion of the pad conductive layer 104. The opening 108 is formed by performing the following steps. First, a patterned photo-resistant layer (not shown) is formed over the dielectric layer 106. Next, the dielectric layer 106 etched using the patterned photo-resistant layer as a mask to form an opening 108 until the pad conductive layer 104 is exposed.

Figure 1C:
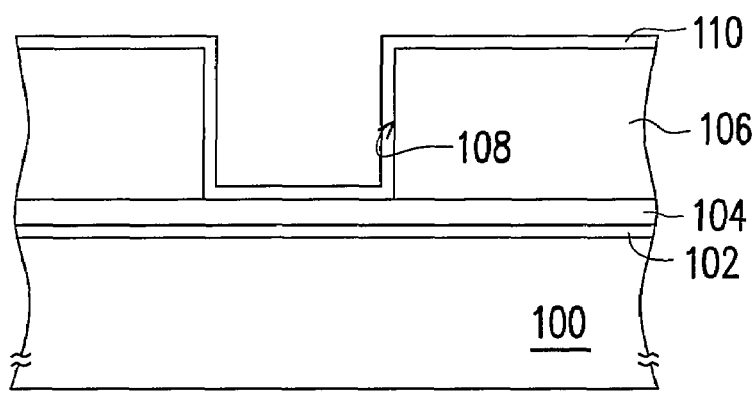

Next, referring to FIG. 1C, a liner conductive layer 110 is formed over the substrate 100 to covering the dielectric layer 106 and the pad conductive layer 104. A material of the liner conductive layer 110 is, for example, undoped poly-silicon, and may be formed by performing, for example, a CVD process.

Figure 1D:
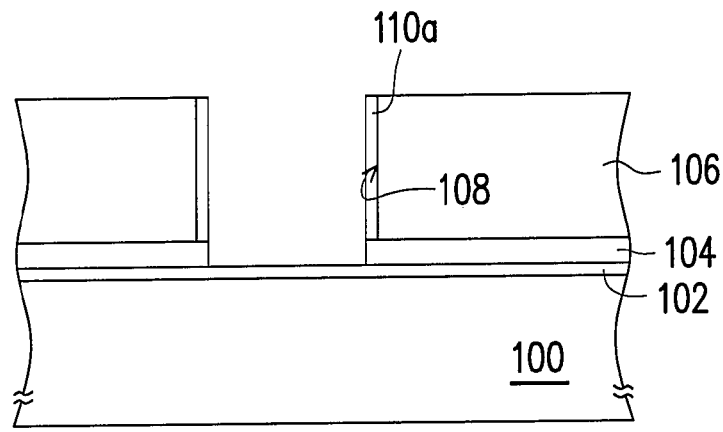

Next, referring to FIG. 1D, an etching process may be performed to remove a portion of the liner conductive layer 110 to form a conductive spacer 110a at a sidewall of the opening 108. Further, when removing the portion of liner conductive layer 110 to form the conductive spacer 110a, a portion of the pad conductive layer 104 is simultaneously removed to expose a surface of the pad oxide layer 102.

Figure 1E:
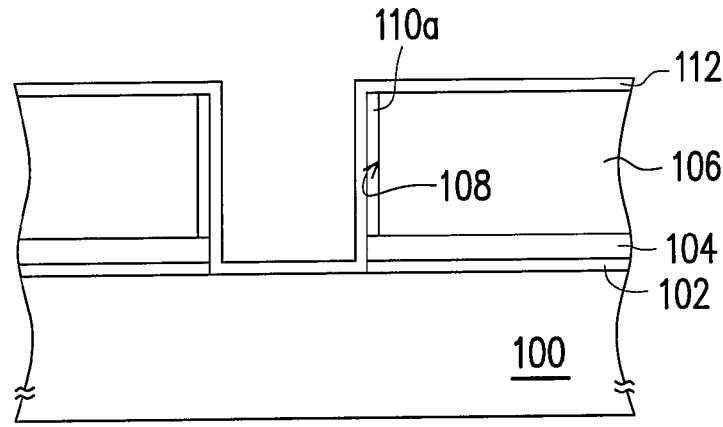

Next, referring to FIG. 1E, an etching process is performed to remove the pad oxide layer 102 at a bottom of the opening 108. Next, a gate oxide layer 112 is formed over the substrate 100. A material of the gate oxide layer 112 is, for example, silicon oxide, and may be formed by, for example, a thermal oxidizing process.

Figure 1F:
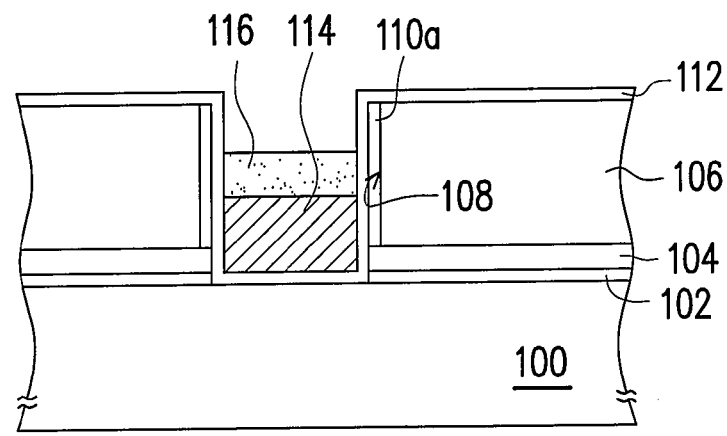

Next, referring to FIG. 1F, a gate conductive layer 114 is formed on the gate oxide layer 112 on the bottom of the opening 108. A material of the gate conductive layer 114 is, for example, poly-silicon or doped poly-silicon. The gate conductive layer 114 may be formed by, for example, the following process. A conductor layer (not shown) is formed over the substrate 100 to fill the opening 108. Next, a chemical mechanical polishing (CMP) process is performed to planarize the conductor layer. Next, an etching-back process is performed to remove a portion of the conductor layer until an upper surface of the conductor layer is lower than an upper surface of the dielectric layer 106.

Next, referring to FIG. 1F, a gate conductive layer 116 is formed on the gate conductive layer 114. A material of the gate conductive layer 116 is, for example, tungsten silicide (WSi), tungsten (W), titanium silicide (TiSi), titanium (Ti), tantalum silicide (TaSi), tantalum (Ta), or any other suitable metal or metal alloy. The gate conductive layer 116 may be formed by, for example, the following process. A conductor layer (not shown) is formed to cover the gate oxide layer 112 and the gate conductive layer 114. Next, a CMP process is performed to planarize the surface of the conductor layer. Next, an etching-back process is performed to remove a portion of the conductor layer until an upper surface of the conductor layer is lower than an upper surface of the dielectric layer 106.

Figure 1G:
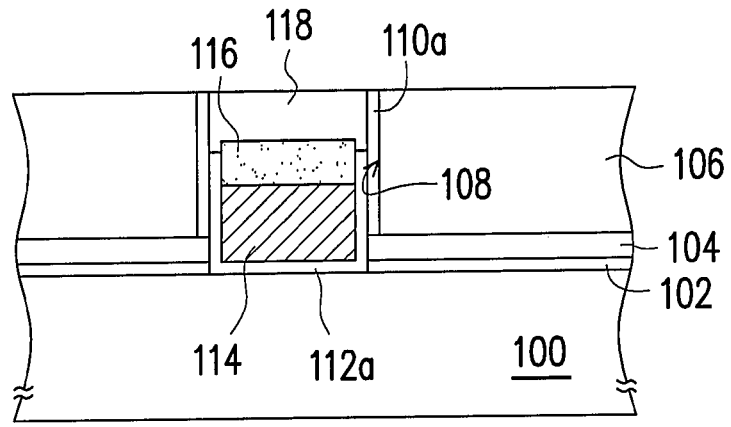

Next, referring to FIG. 1G, a portion of the gate oxide layer 112 is removed to form a gate oxide layer 112a. The gate oxide layer 112a is formed by performing a etch-back process to remove a portion of the gate oxide layer 112 such that an upper surface of the gate oxide layer 112a is lower than an upper surface of the gate conductive layer 116.

Next, referring to FIG. 1G, a cap layer 118 is formed to fill the opening 108. A material of the cap layer 118 is, for example, silicon nitride or other suitable materials. The cap layer 118 may be formed by, for example, the following process. A cap material layer (not shown) is formed over the substrate 100. Next, a CMP process and an etching-back process are sequentially carried out to remove a portion of the cap material layer. The cap layer 118, gate conductive layer 114, gate conductive layer 116 and gate oxide layer 112a constitute a gate structure.

It is to be noted that the cap layer 118 is formed over the gate conductive layer 116 to cover top portion of the gate conductive layers 116, and therefore the cap layer 118 can protect the gate conductive layer 116 from damaged caused by subsequent processes.

Figure 1H:
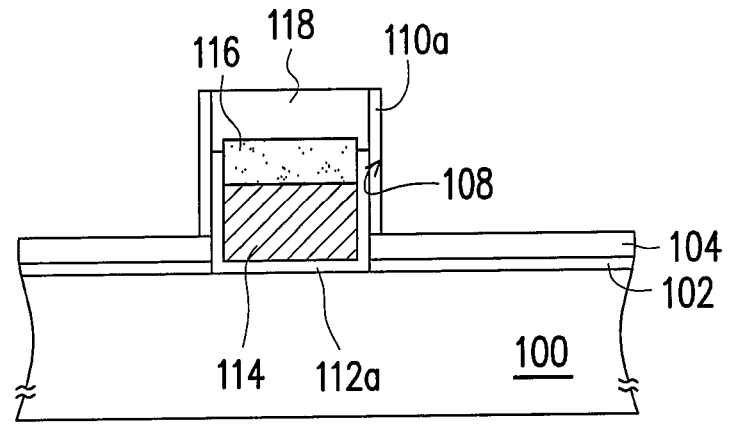

Next, referring to FIG. 1H, the dielectric layer 106 is removed after forming the cap layer 118. The dielectric layer 106 is removed by performing, for example, a wet etching process. During the process of removing the dielectric layer 106, the conductive spacer 110a and the pad conductive layer 104 function to protect the gate structure from being damaged.

Figure 1I:
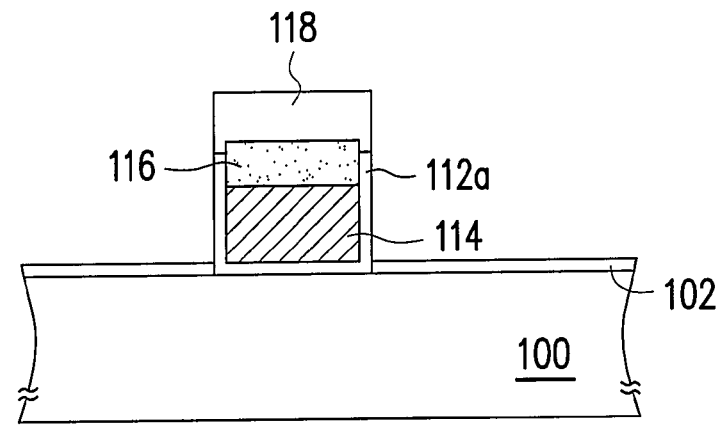

Next, referring to FIG. 1I, the conductive spacer 110a and the pad conductive layer 104 are removed by performing, for example, an etching process after removing the dielectric layer 106. Thereafter, lightly doped region, a source region and a drain region may be formed by carrying out well known process familiar to those of ordinary skill in the art.

Referring to FIG. 1I again, the structure of the gate structure fabricated by the foregoing method is described hereinafter. The gate structure includes a gate conductive layer 114, a gate conductive structure 116, a gate oxide layer 112a and a cap layer 118. The gate conductive layer 114 is disposed over a substrate 100. A material of the gate conductive layer 114 is, for example, poly-silicon or doped poly-silicon. The gate conductive layer 116 is disposed on the gate conductive layer 114. A material of the gate conductive layer 116 is, for example, tungsten silicide (WSi), tungsten (W), titanium silicide (TiSi), titanium (Ti), tantalum silicide (TaSi), tantalum (Ta), or any other suitable metal or metal alloy. The gate oxide layer 112a is disposed between the gate conductive layer 114 and the substrate 100, and at sidewalls of the gate conductive layer 114 and a portion of the gate conductive layer 116. A material of the gate oxide layer 112a is, for example, silicon oxide. The cap layer 118 is disposed on the gate oxide layer 112a covering the gate conductive layer 116. A material of the cap layer 118 is, for example, silicon nitride, or other suitable materials.

Figure 2A:
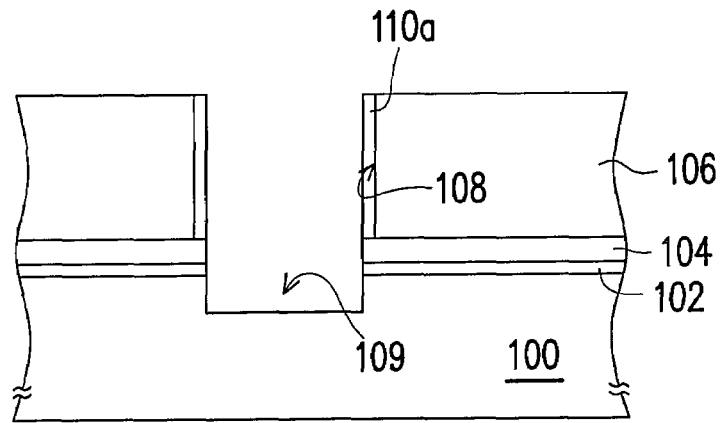
FIGS. 2A through 2E are cross-sectional views showing a flow illustrating a method for fabricating a gate structure according to another embodiment of the present invention.

FIGS. 2A through 2E are cross-sectional views showing a flow illustrating a method for fabricating a gate structure according to another embodiment of the present invention. FIG. 2A is consecutive from FIG. 1D. Legends used in FIGS. 2A through 2E are consistent with FIGS. 1A through 1I, in that same legends are used for same items, and descriptions thereof are skipped over hereby.

Referring to FIG. 2A, the pad oxide layer 102 at a bottom of the opening 108, and a portion of the substrate 100 are removed to form a recess 109 in the substrate 100, by performing, for example, an etching process.

Figure 2B:
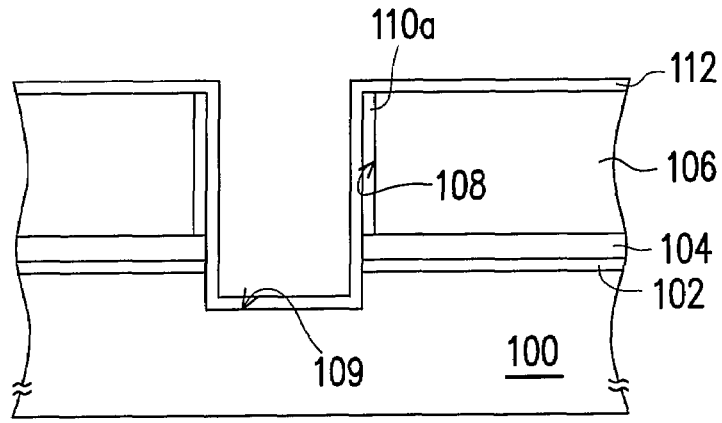

Next, referring to FIG. 2B, a gate oxide layer 112 is formed over the substrate 100. According to an aspect of the embodiment, a pre-cleaning process may be performed before the gate oxide layer 112 is formed to remove residues in the recess 109.

Figure 2C:
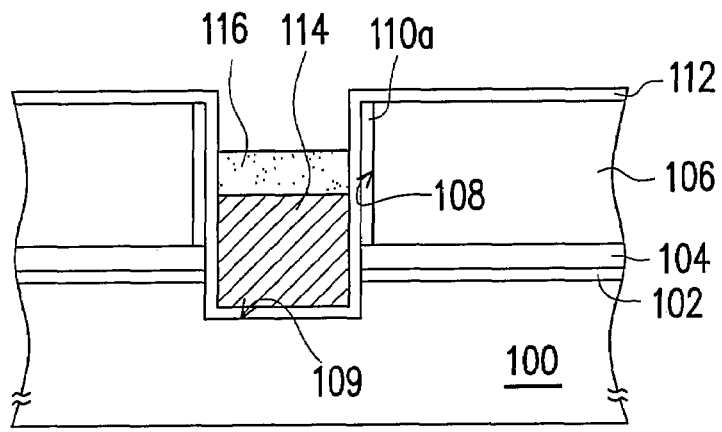

Next, referring to FIG. 2C, a gate conductive layer 114 is formed in the recess 109 and on the gate oxide layer 112 at the bottom of the opening 108. Next, a gate conductive layer 116 is formed on the gate conductive layer 114 after the gate conductive layer 114 is formed, wherein an upper surface of the gate conductive layer 116 is lower than an upper surface of the dielectric layer 106.

Figure 2D:
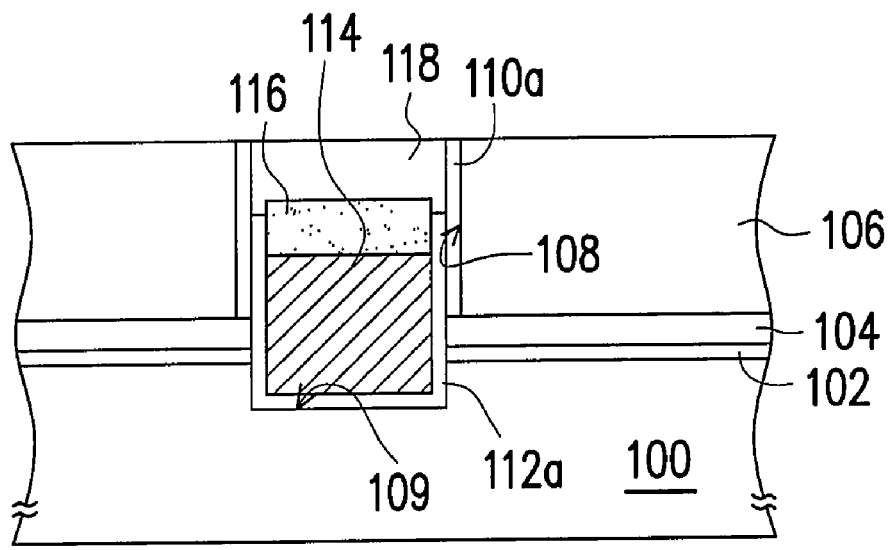

Next, Referring to FIG. 2D, a gate oxide layer 112a is formed by removing a portion of the gate oxide layer 112, wherein an upper surface of the gate oxide layer 112a is lower than the upper surface of the gate conductive layer 116. Next, the opening 108 is filled by a cap layer 118. The cap layer 118 covers top portions of the gate conductive layer 116 to protect the gate conductive layer 116 from damage caused by subsequent processes.

The foregoing cap layer 118, gate conductive layer 114, gate conductive layer 116 and gate oxide layer 112a constitute the gate structure having a recess channel structure, which is adapted to reduce SCE and leakage current.

Figure 2E:
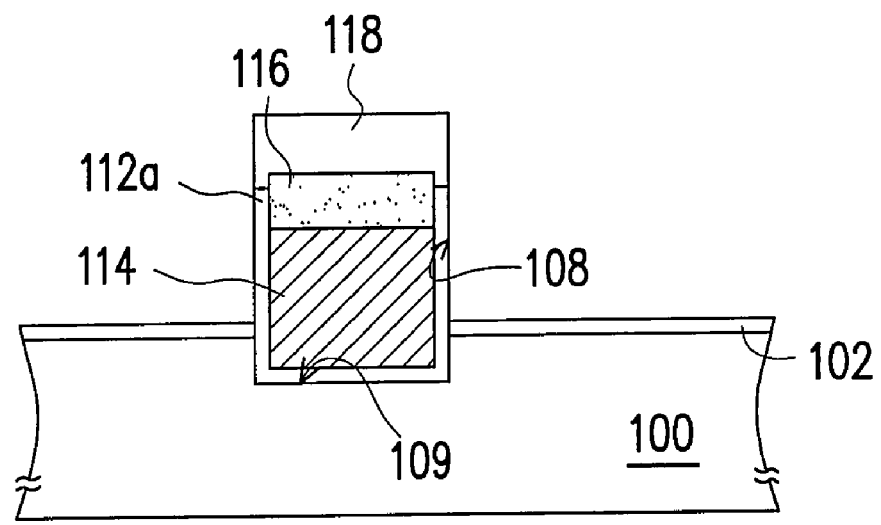

Next, referring to FIG. 2E, after the cap layer 118 is formed, the dielectric layer 106 is removed, during which the conductive spacer 110a and the pad conductive layer 104 protect the gate structure from damage. Next, after the dielectric layer 106 is removed, the conductive spacer 110a and the pad conductive layer 104 are further removed. Thereafter, subsequent processes are carried to form, for example a lightly doped region, a source region and a drain region, well known to those of ordinary skill in the art.

In summary, according to an aspect of the present invention, the fabrication method may employed to effectively increase the channel length to reduce the SCE and leakage current. Furthermore, the alignment errors in defining gate structures may be effectively avoided.

Referring to FIG. 2E again, the structure of the gate structure fabricated by the foregoing method of the present invention is described hereinafter. The gate structure includes a gate conductive layer 114, a gate conductive layer 116, a gate oxide layer 112a and a cap layer 118. The gate conductive layer 114 is disposed in a recess 109, which bottom exposes an upper surface of the substrate 100, wherein an upper surface of the gate conductive layer 114 is higher than the upper surface of the substrate 100. The gate conductive layer 116 is disposed on the gate conductive layer 114. The gate oxide layer 112a is disposed between the gate conductive layer 114 and the substrate 100, and at sidewalls of the gate conductive layer 114 and a portion of the gate conductive layer 116. The cap layer 118 is disposed on the gate oxide layer 112a covering the gate conductive layer 116.

The fabrication method of the present invention may also be integrated with the process for forming the peripheral circuit area, for example, in a process for forming a memory, in which the memory cell area and the peripheral circuit area are simultaneously fabricated. FIGS. 3A through 3K are cross-sectional views showing a flow of a method for fabricating a memory according to an embodiment of the present invention.

Figure 3A:
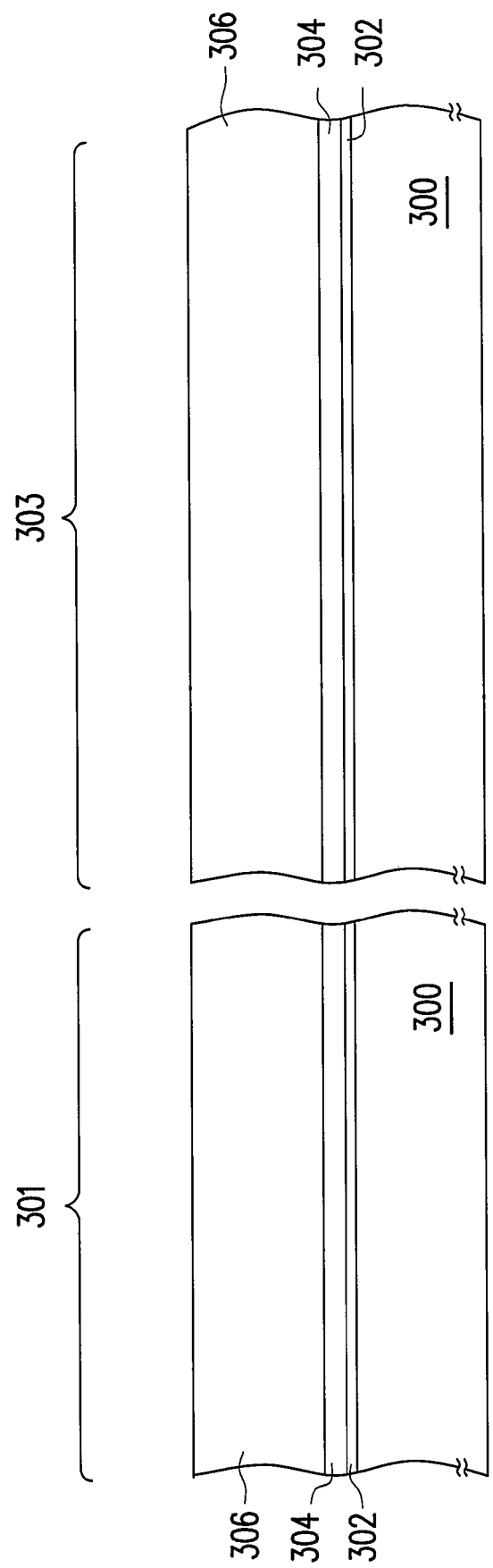

First, referring to FIG. 3A, a substrate 300 is provided. The substrate 300 has a memory cell area 301 and a peripheral circuit area 303. According to an aspect of the embodiment of the present invention, a transistor having a recess channel is formed in the memory cell area 301, and a dual work function CMOS transistor is formed in the peripheral circuit area 303.

Next, referring to FIG. 3A, a pad oxide layer 302 is formed on the substrate 300. The pad oxide layer 302 is comprised of, for example, silicon oxide, and may be formed by performing, for example, a thermal oxidizing process. Next, a pad conductive layer 304 is formed on the pad oxide layer 302. The pad conductive layer 304 is comprised of, for example, undoped poly-silicon, and may be formed by performing, for example, a CVD process. Next, a dielectric layer 306 is formed on the pad conductive layer 304. The dielectric layer 306 is comprised of, for example but not limited to, phosphor silicon glass (PSG), boron phosphor silicon glass (BPSG), or other suitable dielectric materials, and may be formed by, for example, a CVD process.

Figure 3B:
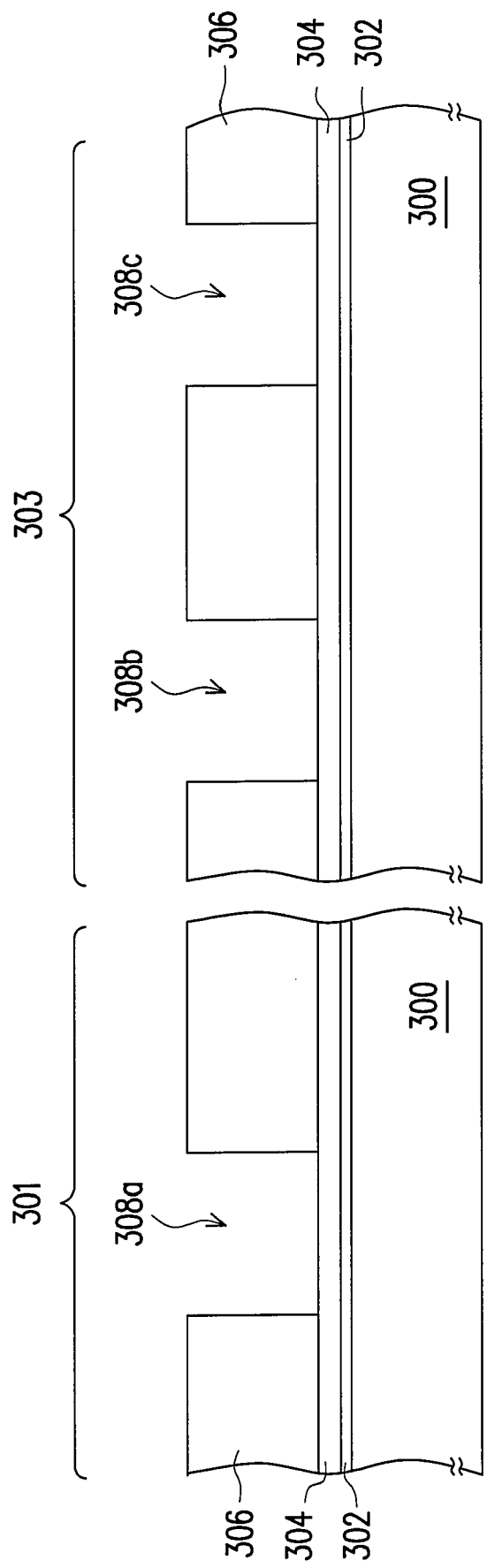

Next, referring to FIG. 3B, a portion of the dielectric layer 306 is removed to form an opening 308a exposing a portion of the pad conductive layer 304 in the memory cell area 301, and openings 308b and 308c exposing a portion of the pad conductive layer 304 in the peripheral circuit area 303. The openings 308a, 308b and 308c may be formed by, for example, the following process. First, a patterned photo-resistant layer (not shown) is formed on the dielectric layer 306. Next, the dielectric layer 306 etched using the patterned photo-resistant layer as a mask until the pad conductive layer 304 is exposed to form the openings 308a, 308b, and 308c. The opening 308a is adapted for defining an area of a transistor of the memory cell area 301, and the openings 308b and 308c are adapted for respectively defining N-type, P-type CMOS transistors in the peripheral circuit area 303.

Figure 3C:
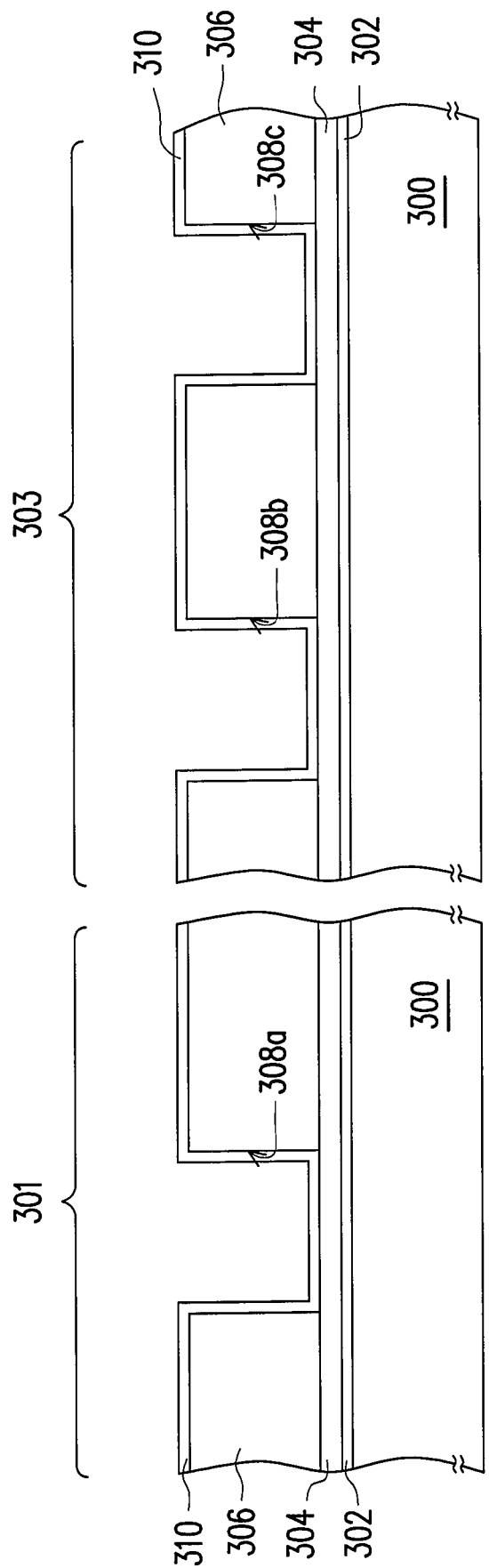

Next, referring to FIG. 3C, a liner conductive layer 310 is formed over the substrate 300 to cover the dielectric layer 306 and the pad conductive layer 304. The liner conductive layer 310 is comprised of, for example, undoped poly-silicon, and may be formed by, for example, a CVD process.

Figure 3D:
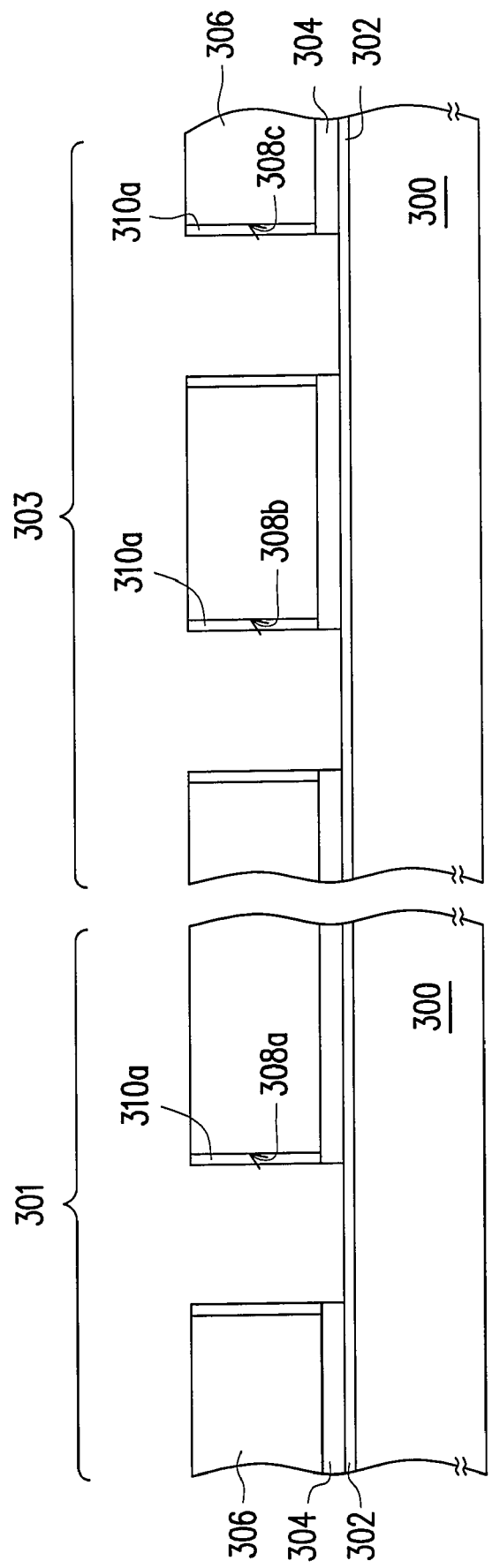

Next, referring to FIG. 3D, a portion of the liner conductive layer 310 is removed to form conductive spacers 310a on sidewalls of the openings 308a, 308b and 308c. The portion of liner conductive layer 310 is removed by performing, for example, an etching process. Further, when removing the portion of liner conductive layer 310 to form the conductive spacer 310a, a portion of the pad conductive layer 304 is simultaneously removed to expose a surface of the pad oxide layer 302.

Figure 3E:
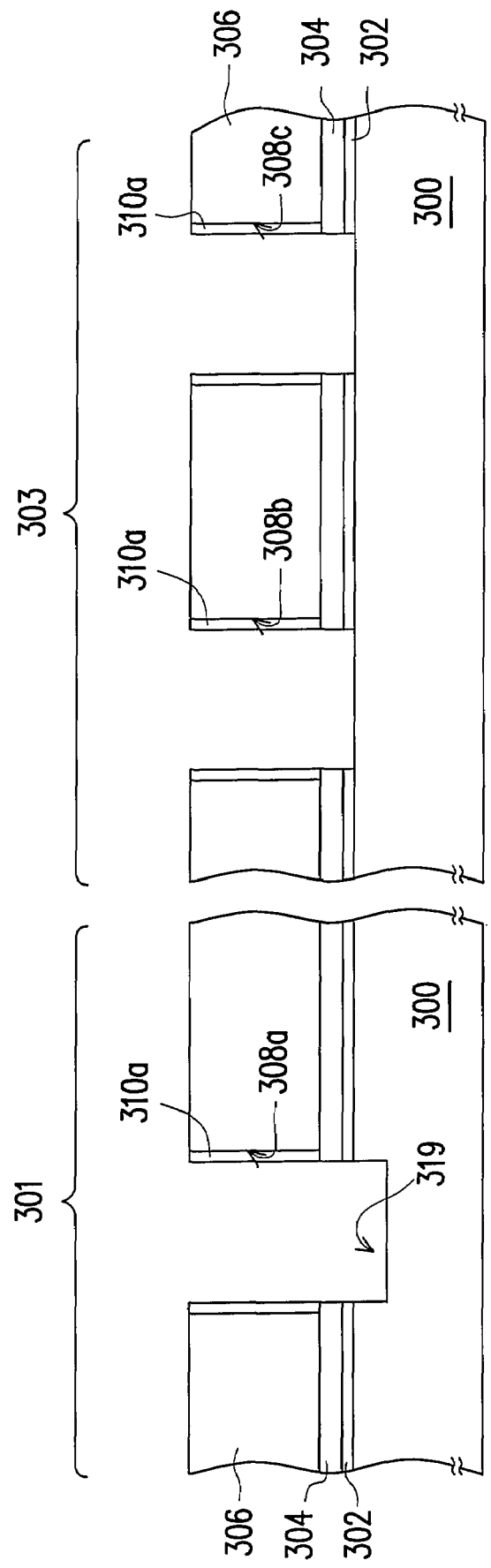

Next, referring to FIG. 3E, the pad oxide layer 302 at a bottom of the opening 308a and a portion of the substrate 300 is removed to form a recess 319 in the substrate 300. The recess 319 may be formed by, for example, the following process. A photo-resistant layer (not shown) is formed to cover the dielectric layer 306 in the peripheral circuit area 303, and the substrate 300. Next, the substrate 300 in the memory cell area 301 is etched to form the recess 319. Next, the photo-resistant layer is removed.

Next, further referring to FIG. 3E, a pre-cleaning process is performed after the recess 319 is formed to clean the bottom of the recess 319, and simultaneously remove the pad oxide layer 302 on bottoms of the openings 308b and 308c. The foregoing pre-cleaning process is, for example, an etching process.

Figure 3F:
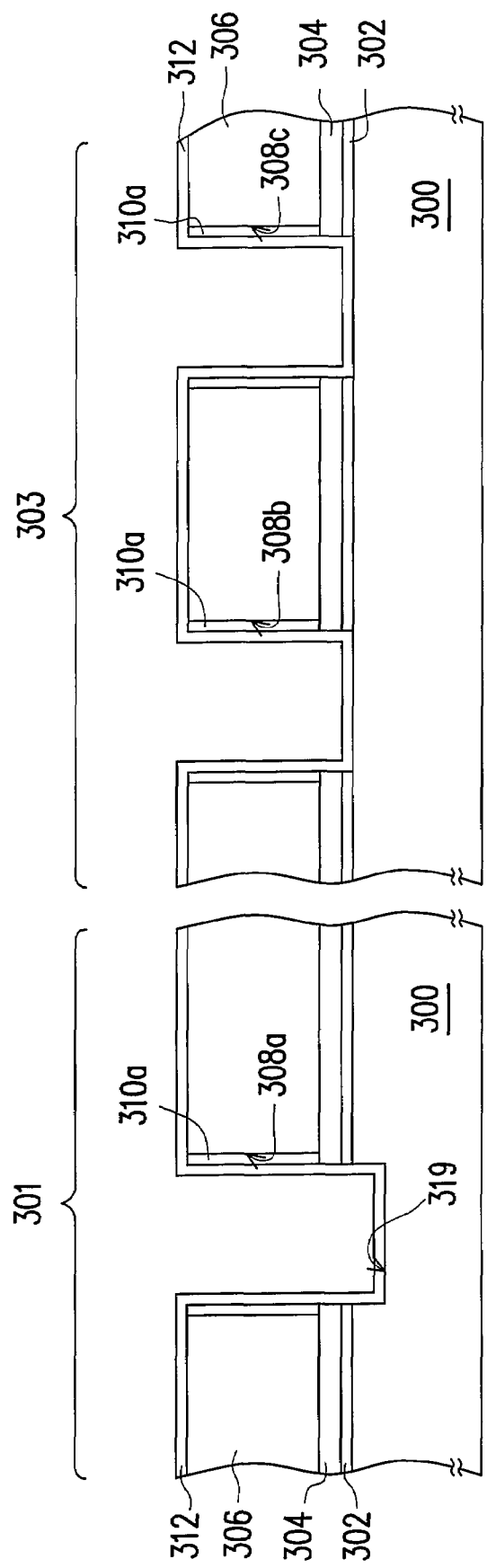

Next, referring to FIG. 3F, a gate oxide layer 312 is formed over the substrate 300. The gate oxide layer 312 is comprised of, for example, silicon oxide, and may be formed by performing, for example, a thermal oxidizing process. According to an embodiment of the present invention, after the gate oxide layer 312 is formed, a nitridation process is performed to the gate oxide layer 312 in the peripheral circuit area 303 to avoid dopant diffusion caused by subsequent processes, which may otherwise adversely affects functions of the device.

Figure 3G:
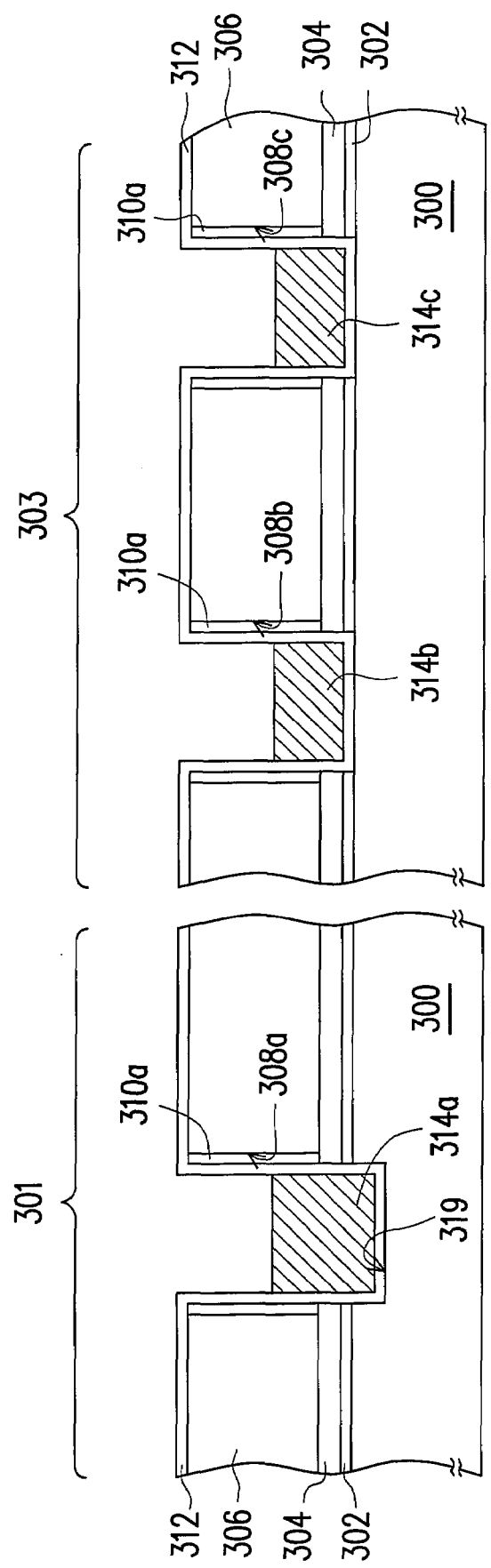

Next, referring to FIG. 3G, a gate conductive layer 314a is formed in the recess 319 and on the gate oxide layer 312 at the bottom of the opening 308a. Gate conductive layers 314b, 314c are formed on the gate oxide layer 312 at respective bottoms of the openings 308b and 308c. For example, the gate conductive layer 314a of the memory cell area 301 is an N-type doped poly-silicon layer, and the gate conductive layers 314b, 314c of the peripheral circuit layer 303, are an N-type doped poly-silicon layer and a P-type doped poly-silicon layer, respectively.

According to an embodiment of the present invention, the gate conductive layers 314a, 314b and 314c are formed by, for example, the following process. A N-type doped poly-silicon layer (not shown) is formed over the substrate 300 to fill openings 308a, 308b and 308c, respectively. Next, a CMP process is performed to planarize the N-typed doped poly-silicon layer. Next, an etching-back process is performed to remove a portion of the N-type doped poly-silicon layer until an upper surface of the N-type doped poly-silicon layer is lower than an upper surface of the dielectric layer 306. Next, using a photo-resistant layer as a mask to cover areas of N-type devices, an ion implementation process is carried out to transform one of the two N-type doped poly-silicon layers of 308b and 308c to a P-type doped poly-silicon layer.

According to another embodiment of the present invention, the gate conductive layer 314a, 314b, 314c are formed by, for example, the following process. An undoped poly-silicon layer (not shown) is formed over the substrate 300 to fill the openings 308a, 308b and 308c. Next, a CMP process is performed to planarize the updoped poly-silicon layer. Next, an etching process is performed to remove a portion of the undoped poly-silicon until an upper surface of the undoped poly-silicon layer is lower than an upper surface of the dielectric layer 306. Next, using a photo-resistant layer as a mask to cover areas of respectively N-type devices and P-type devices, an ion implementation process is carried out to transform the undoped poly-silicon layer in the opening 308a to an N-type doped poly-silicon layer, and the undoped poly-silicon layers in the openings 308b and 308c to an N-type doped poly-silicon layer and a P-type doped poly-silicon layer, respectively.

Figure 3H:
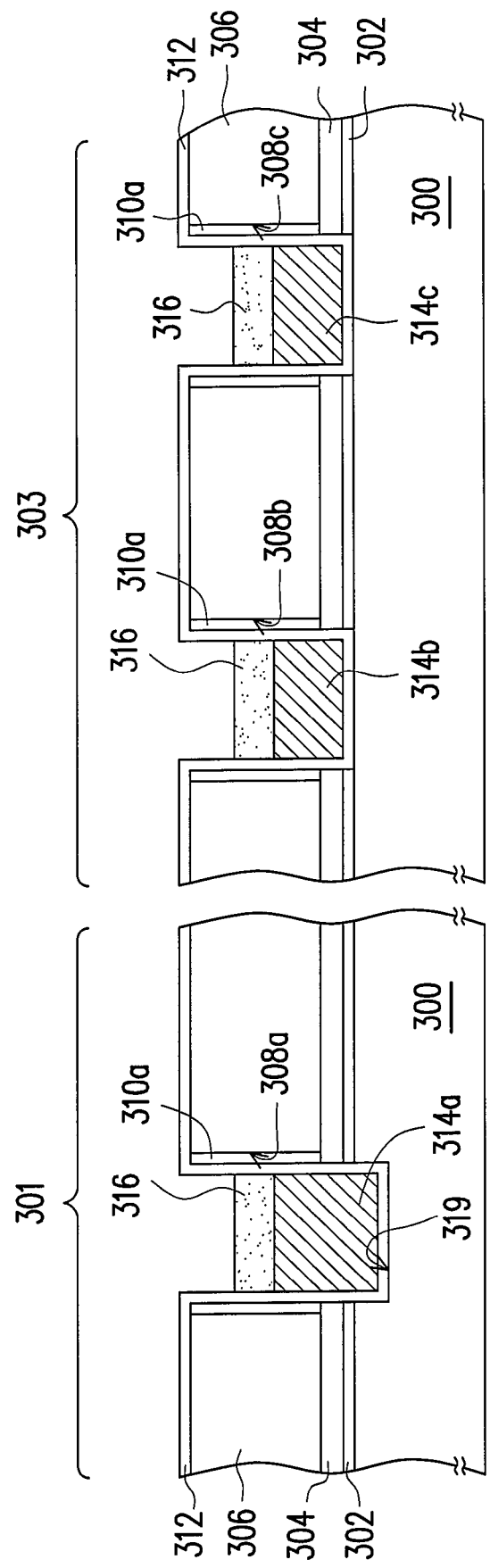
Figure 31:
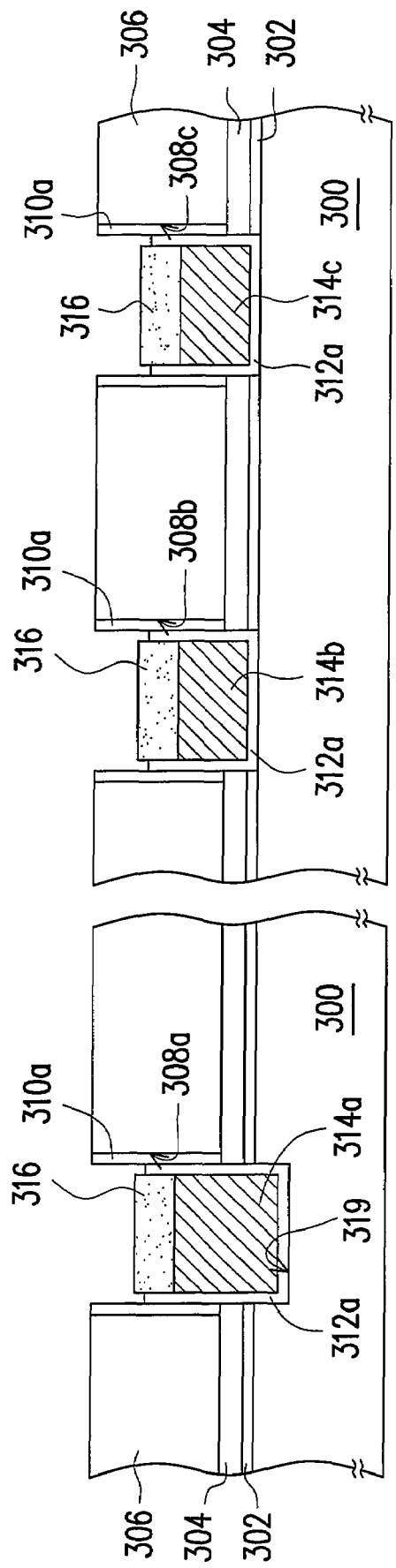

Next, referring to FIG. 3H, a gate conductive layer 316 is formed on the gate conductive layers 314a, 314b and 314c. A material of the gate conductive layer 316 is, for example, tungsten silicide, tungsten, titanium silicide, titanium, tantalum silicide, tantalum, or other suitable metal or metal alloy. A process of forming the gate conductive layer 316, for example, is described as follows. A conductive material layer (not shown) is formed to cover the gate oxide layer 312 and the gate conductive layers 314a, 314b, and 314c. Next, a CMP process is performed to planarize the conductive material layer. Next, an etching process is performed to remove a portion of the conductive material layer until an upper surface of the conductive material layer is lower than the dielectric layer 306.

In the foregoing, the gate conductive layers 314a and 316 in the memory cell area 301 serve as a gate of the transistor having a recess channel, and the gate conductive layers 314b, 316, and gate conductive layers 314c, 316 that are located in the peripheral circuit area 303 serve as the gate of the dual work function CMOS transistor.

Next, referring to FIG. 3I, a portion of the gate oxide layer 312 is removed to form a gate oxide layer 312a. The gate oxide layer 312a is formed by performing an etch-back process to remove a portion of the gate oxide layer 312 until an upper surface of the gate oxide layer 312a is lower than an upper surface of the gate conductive layer 316.

Figure 3J:
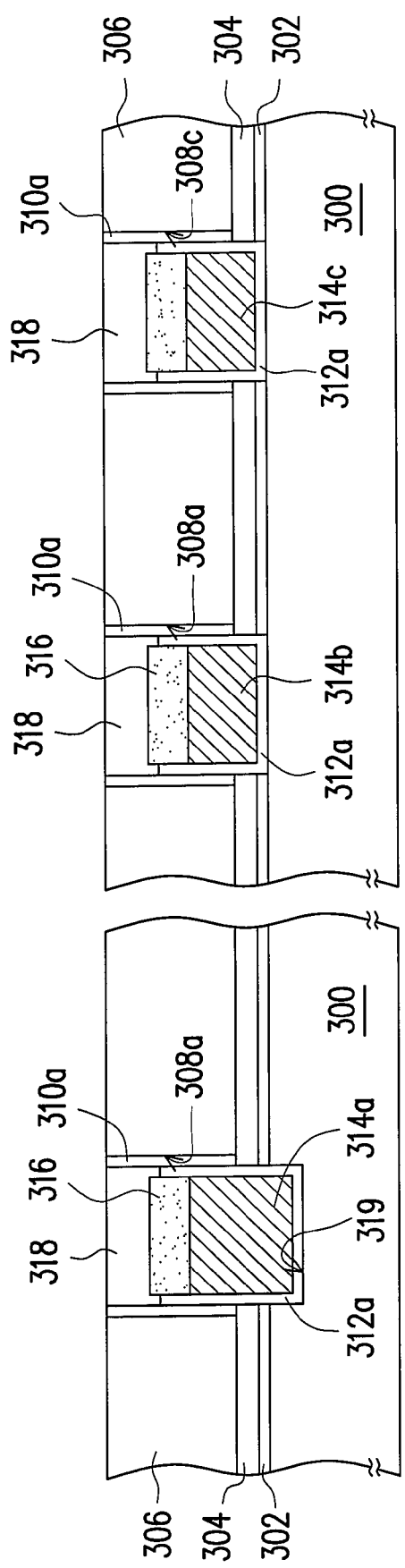

Next, referring to FIG. 3J, a cap layer 318 is formed to fill the openings 308a, 308b, and 308c. A material of the cap layer 318 is, for example, silicon nitride or other suitable materials. The cap layer 318 is formed by, for example, the following process. A cap material layer (not shown) is formed over the substrate 300. Next, a CMP process and an etching process are sequentially performed to remove a portion of the cap material layer. The cap layer 318 covers top portions of the gate conductive layer 316 to protect the gate, conductive layer 316 by from damage during the subsequent processes.

Figure 3K:
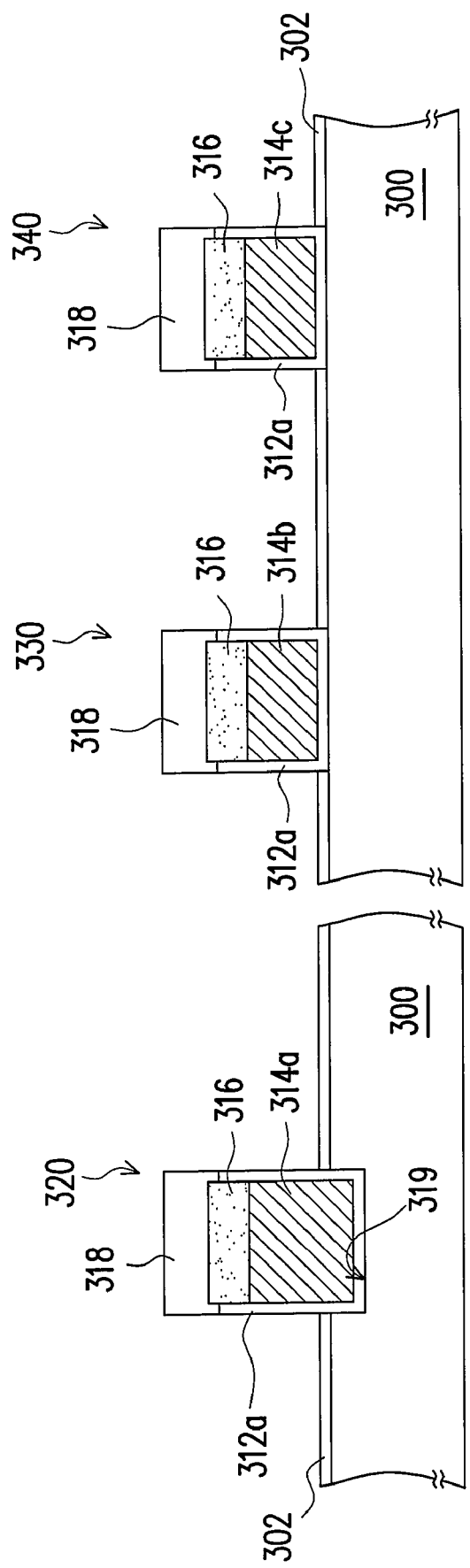

Next, referring to FIG. 3K, the dielectric layer 306 is removed after the cap layer 318 is formed. The dielectric layer 306 is removed by performing, for example, a wet etching process. During the process of removing the dielectric layer 306, the conductive spacer 310a and the pad conductive layer 304 protect the gate from being damaged. After the dielectric layer 306 is removed, the conductive spacer 310a and the pad conductive layer 304 are removed by performing, for example, an etching process. Thereafter, subsequent processes well known to those skilled in the art are carried out to form for example, a lightly doped region, a source region, and a drain region.

In general, the cap layer 318, the gate conductive layer 314a, the gate conductive layer 316 and the gate oxide layer 312a constitute a gate structure 320. The gate structure 320 is a transistor having a recess channel in the memory cell area 301. Further, the cap layer 318, the gate conductive layer 314b, the gate conductive layer 316 and the gate oxide layer 312a also constitute a gate structure 330, and the cap layer 318, the gate conductive layer 314c, the gate conductive layer 316, and the gate oxide layer 312a constitute another gate structure 340. The gate structures 330 and 340 are two gate structures of the dual work function CMOS transistor in the peripheral circuit area 303, which are an N-type gate structure and a P-type gate structure, respectively.

In the fabricating method according to the present invention, the gate of the transistor having a recess channel in a memory cell area 301 is aligned in a self aligned manner so that alignment errors that often occur in the conventional recess channel process can be effectively avoided. Furthermore, problems like poor thermal stability and gate dopant diffusion that often occur in the conventional gate structures for dual work function CMOS transistors in peripheral circuit areas can also be effectively avoided.

The present invention is adapted for forming a CMOS transistor layout. In such a CMOS transistor layout, CMOS transistors thereof are dual work function CMOS transistors, and they are also cut-off type CMOS transistors as can be illustrated with reference to FIG. 4. The method for fabricating the CMOS transistor layout is similar to the process flow of the above illustrated memory in the peripheral circuit area 303. Therefore, those of ordinary skill in the art can deduce the method described with reference to FIGS. 3A through 3K.

Figure 4:
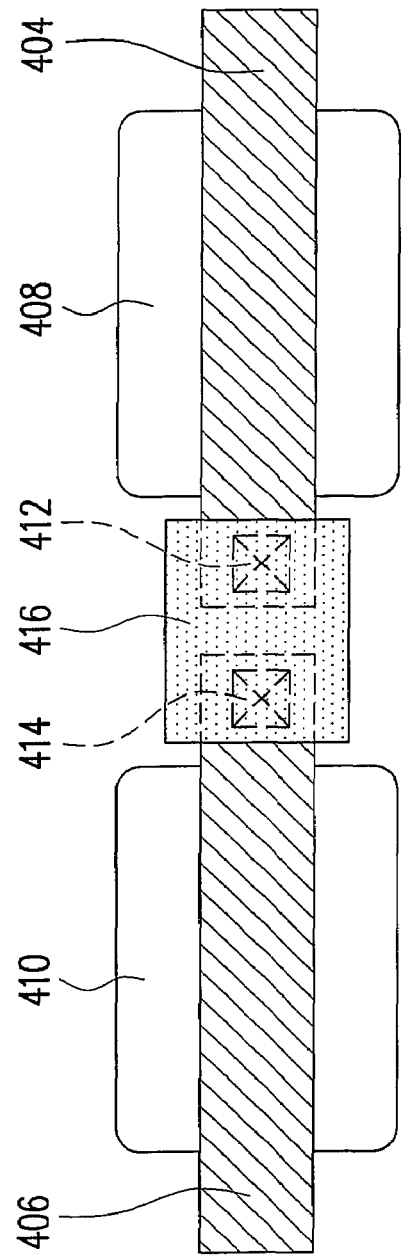
FIG. 4 is a schematic diagram illustrating a CMOS transistor layout according to an embodiment of the present invention.

Referring to FIG. 4, a CMOS transistor layout according to an embodiment of the present invention is shown. The CMOS transistor includes an N-type transistor and a P-type transistor, wherein a gate electrode 404 of the N-type transistor and a gate electrode 406 of the P-type transistor are isolated by a gap from each other. A source/drain zone 408 of the N-type transistor and a source/drain zone 410 of the P-type transistor are respectively disposed at two sides of the gate electrodes 404 and 406. Two contact windows 412 and 414 formed on the gate electrodes 404 and 406, respectively. A conductive layer 416 is formed on the contact windows 412 and 414, so as to electrically connect the two gate electrodes 404 and 406.

Figure 5:
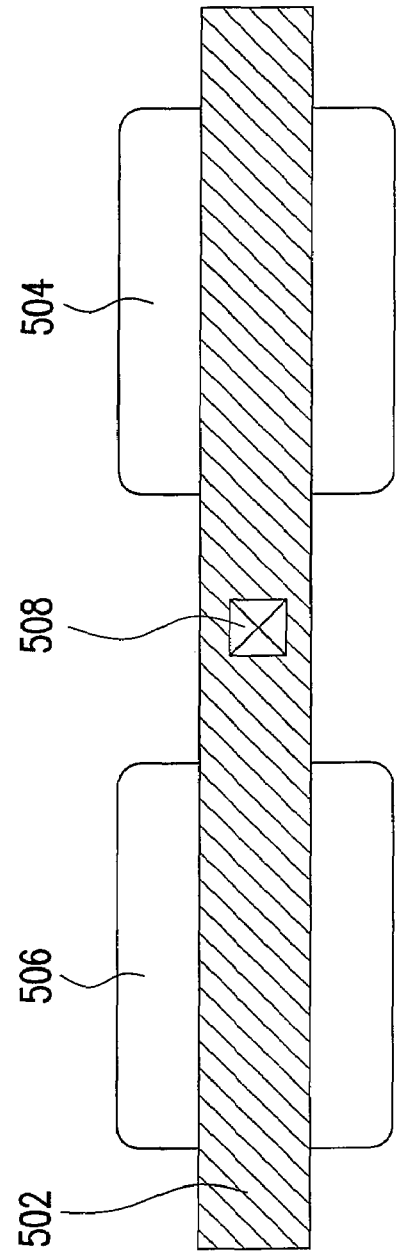
FIG. 5 is a schematic diagram illustrating a conventional CMOS transistor layout.

Compared a conventional CMOS transistor layout as shown in FIG. 5, source/drain regions 504 and 506 of the N-type transistor and the P-type transistor are distributed at two sides of the gate electrode 502, and the contact window 508 is electrically connected to the gate electrode 502. Therefore, the gate dopant diffusion in subsequent thermal treatment process may be effectively avoided.

In summary, the fabricating method according to the present invention may be adapted for avoiding alignment errors in defining gate structures. Further, the cap layer covering top portions of the gate conductive layer may serve to protect the gate conductive layer from damage during subsequent processes. Furthermore, the area where the transistors are to be formed defined before forming the gate structure, so that gate dopant diffusion in subsequent thermal treatment process that would adversely affect reliability of the device may be effectively avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a gate structure, comprising:
sequentially forming a pad oxide layer, a pad conductive layer and a dielectric layer over a substrate;
removing a portion of the dielectric layer to form an opening exposing a portion of the pad conductive layer;
forming a liner conductive layer to cover the dielectric layer and the pad conductive layer;
removing a portion of the liner conductive layer and a portion of the pad conductive layer to expose a surface of the pad oxide layer to form a conductive spacer at a sidewall of the opening;
removing the pad oxide layer at a bottom of the opening;
forming a gate oxide layer over the substrate;
sequentially forming a first gate conductive layer and a second gate conductive layer over the gate oxide layer at a bottom of the opening, wherein an upper surface of the second gate conductive layer is lower than an upper surface of the dielectric layer;
removing a portion of the gate oxide layer until an upper surface of the gate oxide layer is lower than an upper surface of the second gate conductive layer; and
forming a cap layer to fill up the opening.

2. The method for fabricating a gate structure according to claim 1, wherein the method of removing a portion of the gate oxide layer comprises performing an etching process.

3. The method for fabricating a gate structure according to claim 1, wherein a material of the cap layer comprises silicon nitride.

4. The method for fabricating a gate structure according to claim 1, wherein a material of the first gate conductive layer comprises poly-silicon or doped poly-silicon.

5. The method for fabricating a gate structure according to claim 1, wherein a material of the second gate conductive layer comprises tungsten silicide, tungsten, titanium silicide, titanium, tantalum silicide or tantalum.

6. The method for fabricating a gate structure according to claim 1, after forming the cap layer, further comprising:
removing the dielectric layer; and
removing the conductive spacer and the pad conductive layer.

7. A method for fabricating a gate structure, comprising:
sequentially forming a pad oxide layer, a pad conductive layer and a dielectric layer over a substrate;
removing a portion of the dielectric layer to form an opening exposing a portion of the pad conductive layer;
forming a liner conductive layer to cover the dielectric layer and the pad conductive layer;
removing a portion of the liner conductive layer and a portion of the pad conductive layer to expose a surface of the pad oxide layer to form a conductive spacer at a sidewall of the opening;
removing the pad oxide layer at a bottom of the opening and a portion of the substrate to form a recess in the substrate;
forming a gate oxide layer over the substrate;
sequentially forming a first gate conductive layer and a second gate conductive layer in the recess and on the gate oxide layer over a bottom of the opening, wherein an upper surface of the second gate conductive layer is lower an upper surface of the dielectric layer;
removing a portion of the gate oxide layer until an upper surface of the gate oxide layer is lower than an upper surface of the second gate conductive layer; and
forming a cap layer to fill up the opening.

8. The method for fabricating a gate structure according to claim 7, wherein the method of removing a portion of the gate oxide layer comprises performing an etching process.

9. The method for fabricating a gate structure according to claim 7, wherein a material of the cap layer comprises silicon nitride.

10. The method for fabricating a gate structure according to claim 7, wherein a material of the first gate conductive layer comprises poly-silicon or doped poly-silicon.

11. The method for fabricating a gate structure according to claim 7, wherein a material of the second gate conductive layer comprises tungsten suicide, tungsten, titanium silicide, titanium, tantalum suicide or tantalum.

12. The method for fabricating a gate structure according to claim 7, after forming the cap layer, further comprising:
removing the dielectric layer; and
removing the conductive spacer and the pad conductive layer.

13. A method for fabricating a memory, comprising:
providing a substrate having a memory cell area and a peripheral circuit area formed thereon;
sequentially forming a pad oxide layer, a pad conductive layer and a dielectric layer over the substrate;
removing a portion of the dielectric layer to form a first opening in the memory cell area and two second openings in the peripheral circuit area, wherein the first opening exposes a portion of the pad conductive layer, and the two second openings expose a portion of the pad conductive layer;
forming a liner conductive layer to cover the dielectric layer and the pad conductive layer;
removing a portion of the liner conductive layer and a portion of the pad conductive layer to expose the pad oxide layer and to form conductive spacers at sidewalls of the first opening and the two second openings;
removing a portion of the pad oxide layer at a bottom of the first opening and a portion of the substrate to form a recess in the substrate;
removing the pad oxide layer at bottoms of the two second openings;
forming a gate oxide layer over the substrate;
forming a first gate conductive layer in the recess and on the gate oxide layer on a bottom of the first opening;
forming a second gate conductive layer and a third gate conductive layer on the gate oxide layer on bottoms of the two second openings;
forming a fourth gate conductive layer on the first, the second, and the third gate conductive layers simultaneously, wherein an upper surface of the fourth gate conductive layer is lower than an upper surface of the dielectric layer;
removing a portion of the gate oxide layer until an upper surface of the gate oxide layer is lower than the upper surface of the fourth gate conductive layer; and
forming a cap layer to fill the first opening and the two second openings.

14. The method for fabricating a memory according to claim 13, wherein the method of removing a portion of the gate oxide layer comprises performing an etching process.

15. The method for fabricating a memory according to claim 13, wherein a material of the cap layer comprises silicon nitride.

16. The method for fabricating a memory according to claim 13, wherein the first gate conductive layer comprises an N-type doped poly-silicon layer, the second gate conductive layer comprises an N-type doped poly-silicon layer or a P-type doped poly-silicon layer, and the third gate conductive layer comprises a N-type doped poly-silicon layer or a P-type doped poly-silicon layer.

17. The method for fabricating a memory according to claim 13, a material of the fourth gate conductive layer comprises tungsten suicide, tungsten, titanium suicide, titanium, tantalum silicide or tantalum.

18. The method for fabricating a memory according to claim 13, after forming the gate oxide layer over the substrate, further comprising a step of performing a nitridation process on the gate oxide layer of the peripheral circuit area.

19. The method for fabricating a memory according to claim 13, after forming the cap layer, further comprising:
removing the dielectric layer after forming the cap layer; and
removing the conductive spacers and the pad conductive layer.

20. A method for fabricating a CMOS transistor layout, the CMOS transistor comprising at least an N-type transistor and a P-type transistor, wherein a gate electrode of the N-type transistor is isolated from a gate electrode of the P-type transistor, the method comprising:
sequentially forming a pad oxide layer, a pad conductive layer and a dielectric layer over a substrate;
removing a portion of the dielectric layer to form two openings that expose a portion of an upper surface of the pad conductive layer, and defining a first area where an N-type transistor is to be formed and a second area where a P-type transistor is to be formed;

forming a liner conductive layer to cover the dielectric layer and the pad conductive layer;

removing a portion of the liner conductive layer to expose a surface of the pad oxide layer and a portion of the pad conductive layer to form a conductive spacer at sidewalls of the two openings;

forming a gate oxide layer over the substrate;

forming a first gate conductive layer and a second gate conductive layer on the gate oxide layer over bottoms of the two openings, respectively;

simultaneously forming a third gate conductive layer over the first and the second gate conductive layers, wherein an upper surface of the third gate conductive layer is lower than an upper surface of the dielectric layer;

removing a portion of the gate oxide layer until an upper surface of the gate oxide layer is lower than an upper surface of the third gate conductive layer; and forming a cap layer to fill the two openings.

21. The method for fabricating a CMOS transistor layout according claim 20, wherein the method of removing a portion of the gate oxide layer comprises performing an etching process.

22. The method for fabricating a CMOS transistor layout according claim 20, wherein a material of the cap layer comprises silicon nitride.

23. The method for fabricating a CMOS transistor layout according claim 20, wherein the first gate conductive layer comprises an N-type doped poly-silicon layer or a P-type doped poly-silicon layer, and the second gate conductive layer comprises a N-type doped poly-silicon layer or a P-type doped poly-silicon layer.

24. The method for fabricating a CMOS transistor layout according claim 20, wherein a material of the third gate conductive layer comprises tungsten silicide, tungsten, titanium silicide, titanium, tantalum silicide or tantalum.

25. The method for fabricating a CMOS transistor layout according claim 20, after forming the gate oxide layer over the substrate, further comprising a step of performing a nitridation process on the gate oxide layer.

26. The method for fabricating a CMOS transistor layout according claim 20, after forming the cap layer, further comprising:

removing the dielectric layer; and removing the conductive spacers and the pad conductive layer.

* * * * *